(12) United States Patent
Kragel et al.

(10) Patent No.: US 11,935,609 B2
(45) Date of Patent: Mar. 19, 2024

(54) LINKED XOR FLASH DATA PROTECTION SCHEME

(71) Applicant: Western Digital Technologies, Inc., San Jose, CA (US)

(72) Inventors: Oleg Kragel, San Jose, CA (US); Vijay Sivasankaran, Dublin, CA (US); Man Lung Mui, San Jose, CA (US); Sahil Sharma, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 201 days.

(21) Appl. No.: 17/743,287

(22) Filed: May 12, 2022

(65) Prior Publication Data

US 2023/0368857 A1    Nov. 16, 2023

(51) Int. Cl.
G11C 7/00       (2006.01)
G11C 7/10       (2006.01)
G11C 29/12      (2006.01)
G11C 29/42      (2006.01)
H03K 19/21      (2006.01)

(52) U.S. Cl.
CPC ........... *G11C 29/42* (2013.01); *G11C 7/1039* (2013.01); *G11C 29/1201* (2013.01); *H03K 19/21* (2013.01); *G11C 2029/1202* (2013.01)

(58) Field of Classification Search
CPC .......... G11C 7/22; G11C 7/1006; G11C 7/00; H03K 19/1776; H03K 19/17704
USPC ....................................... 365/189.05, 189.08
See application file for complete search history.

(56) References Cited

U.S. PATENT DOCUMENTS

| | | | |
|---|---|---|---|
| 8,832,528 B2 | 9/2014 | Thatcher et al. | |
| 9,354,973 B2 | 5/2016 | Wakchaure et al. | |
| 9,673,840 B2 | 6/2017 | Kumar | |
| 9,830,093 B2 | 11/2017 | Guo et al. | |
| 9,996,285 B2 | 6/2018 | Kang et al. | |
| 10,339,000 B2 | 7/2019 | Yang et al. | |
| 11,042,432 B1 | 6/2021 | Rao et al. | |
| 2003/0236943 A1* | 12/2003 | Delaney | G06F 11/1076 714/E11.034 |
| 2007/0150790 A1 | 6/2007 | Gross et al. | |
| 2016/0266965 A1 | 9/2016 | B et al. | |
| 2017/0123682 A1 | 5/2017 | Sinclair | |
| 2018/0287632 A1 | 10/2018 | Rom et al. | |

(Continued)

OTHER PUBLICATIONS

L. Zhu et al., "Fault Tolerant Algorithm for NVM to Reuse the Error Blocks," 2016 13th International Conference on Embedded Software and Systems (ICESS), Chengdu, China, 2016, pp. 54-59, doi: 10.1109/ICESS.2016.40. (Year: 2016).

*Primary Examiner* — Son T Dinh
(74) *Attorney, Agent, or Firm* — Michael Best & Friedrich LLP (57) ABSTRACT

Embodiments described herein provide a linked XOR flash data protection scheme for data storage devices. In particular, the embodiments described herein provide a data storage controller with a memory space efficient XOR-based flash data protection/recovery algorithm with minimal flash block space overhead and support of recovery from full plane failure with neighbor planes disturb (NPD) in a single word line. Additionally, the embodiments described herein provide a reduced flash block space dedicated for XOR parity buffers storage by a factor of a number of planes per die without losing the capability to recover from NPD.

20 Claims, 6 Drawing Sheets

(56) References Cited

U.S. PATENT DOCUMENTS

| | | |
|---|---|---|
| 2018/0287634 A1 | 10/2018 | Rom et al. |
| 2019/0354478 A1 | 11/2019 | Kashyap et al. |
| 2020/0218605 A1 | 7/2020 | Subramanian et al. |
| 2020/0218606 A1* | 7/2020 | Ji .................. G11C 11/5642 |
| 2021/0279127 A1 | 9/2021 | Jang et al. |
| 2022/0027233 A1 | 1/2022 | Klein et al. |
| 2022/0075559 A1 | 3/2022 | Balakrishnan et al. |
| 2022/0083221 A1 | 3/2022 | Agarwal et al. |

* cited by examiner

FIG. 7

LINKED XOR FLASH DATA PROTECTION SCHEME

FIELD

This application relates generally to data storage devices, and more particularly, to a linked XOR flash data protection scheme in data storage devices.

BACKGROUND

Flash memory is commonly used in everyday devices including smart telephones, computers, disk drives; and other electronic devices. Compared to other types of memory, flash memory is less expensive, smaller in size, has relatively low power consumption, and is easier to interface electronically.

SUMMARY

Flash memory is susceptible to failures, for example, program failures, silent read failures, and the like. These failures may result in data loss that may reduce the reliability of the data storage device. Accordingly, there is a need to protect host data from failures in the data storage device. Conventional designs implement full die protection if recovery from neighbor planes disturb (NPD) is required. As a result, conventional designs include extra XOR parity buffers stored in flash block space in every word line of the flash block. Accordingly, there is a need to improve the storage space (for example, flash block space overhead) associated with a data protection or recovery scheme and support recovery from full plane failure with NPD.

To solve these and other problems, the embodiments described herein provide a linked XOR flash data protection scheme for data storage devices. In particular, the embodiments described herein provide a data storage controller with a memory space efficient XOR-based flash data protection/recovery algorithm with minimal flash block space overhead and support of recovery from full plane failure with neighbor planes disturb (NPD) in a single word line. Additionally, the embodiments described herein provide the technical advantage of reduced flash block space dedicated for XOR parity buffers storage by a factor of a number of planes per die without losing the capability to recover from NPD.

One embodiment of the present disclosure includes a data storage device. The data storage device includes a memory, a data storage controller, and a bus. The memory includes a plurality of wordlines. The data storage controller includes a data storage controller memory with a linked XOR flash data protection scheme and the data storage controller is coupled to the memory. The bus transfers data between the data storage controller and a host device in communication with the data storage controller. When executing the linked XOR flash data protection scheme, the data storage controller is configured to generate a first full XOR parity buffer based on first flash data associated with a first one or more XOR parity bin groups and across a first one or more of the plurality of wordlines. Additionally, when executing the linked XOR flash data protection scheme, the data storage controller is configured to generate a first reduced XOR parity buffer based on the first full XOR parity buffer and second flash data associated with a second one or more XOR parity bin groups and across a second one or more of the plurality of wordlines. The first reduced XOR parity buffer is smaller in size than the first full XOR parity buffer.

Another embodiment of the present disclosure includes a method. The method includes generating, with a data storage controller, a first full XOR parity buffer based on first flash data associated with a first one or more XOR parity bin groups and across a first one or more of a plurality of wordlines of a memory. The method also includes generating, with the data storage controller, a first reduced XOR parity buffer based on the first full XOR parity buffer and second flash data associated with a second one or more XOR parity bin groups and across a second one or more of the plurality of wordlines. The first reduced XOR parity buffer is smaller in size than the first full XOR parity buffer.

Yet another embodiment of the present disclosure includes an apparatus. The apparatus includes means for generating a first full XOR parity buffer based on first flash data associated with a first one or more XOR parity bin groups and across a first one or more of a plurality of wordlines. The apparatus also includes means for generating a first reduced XOR parity buffer based on the first full XOR parity buffer and second flash data associated with a second one or more XOR parity bin groups and across a second one or more of the plurality of wordlines. The first reduced XOR parity buffer is smaller in size than the first full XOR parity buffer.

Various aspects of the present disclosure provide for improvements data storage devices. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the data storage controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the present disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, MRAM, etc.

Figure 1:
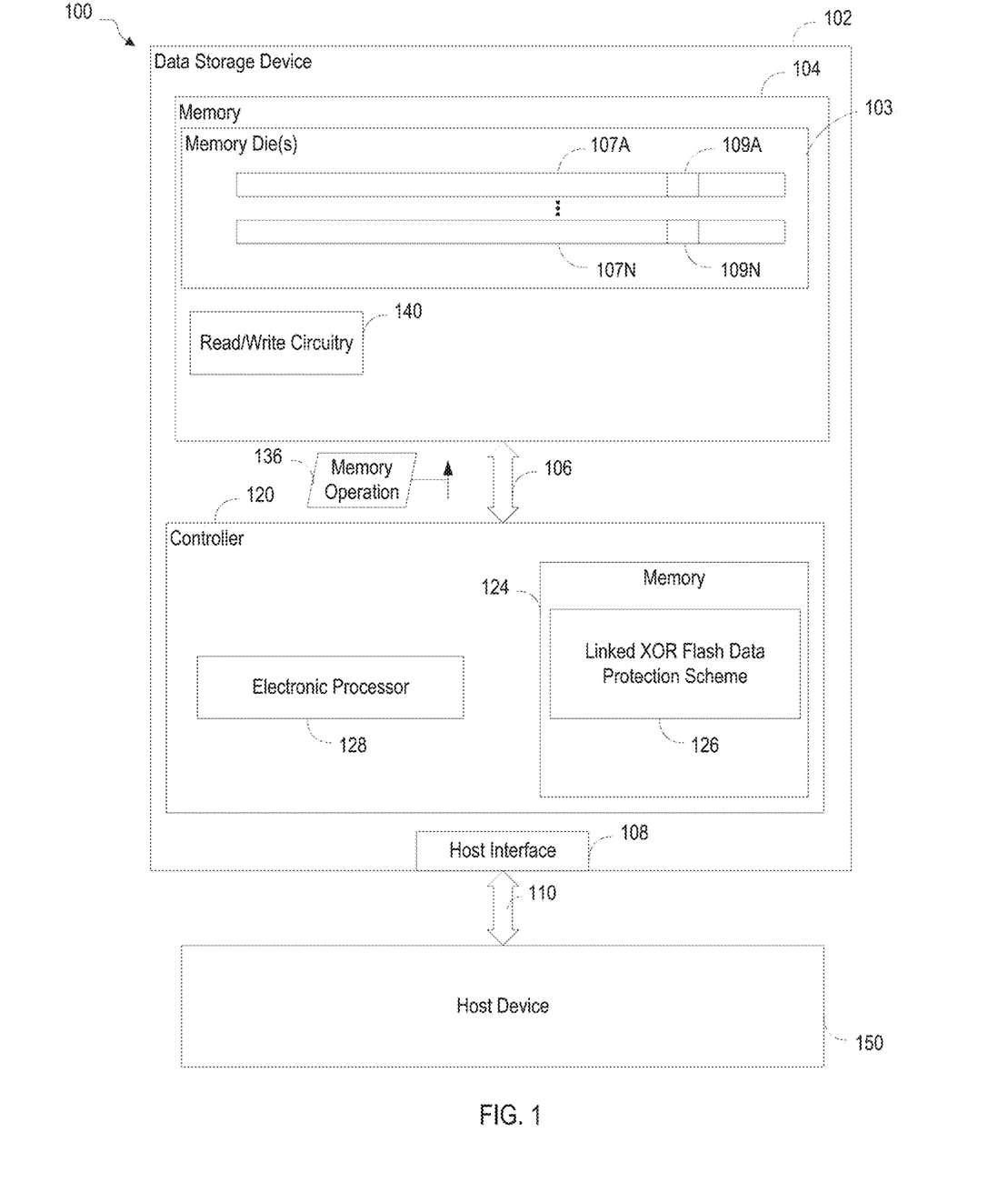
FIG. 1 is block diagram of a system including a data storage device and a host device, in accordance with some embodiments of the disclosure.

FIG. 1 is block diagram of a system including a data storage device and a host device, in accordance with some embodiments of the disclosure. In the example of FIG. 1, the system 100 includes a data storage device 102 and a host device 150. The data storage device 102 includes a controller 120 (referred to hereinafter as "data storage device controller") and a memory 104 (e.g., non-volatile memory) that is coupled to the data storage device controller 120.

One example of the structural and functional features provided by the data storage device controller 120 are illustrated in FIG. 1 in a simplified form. One skilled in the art would also recognize that the data storage device controller 120 may include additional modules or components other than those specifically illustrated in FIG. 1. Additionally, although the data storage device 102 is illustrated in FIG. 1 as including the data storage device controller 120, in other implementations, the data storage device controller 120 is instead located separate from the data storage device 102. As a result, operations that would normally be performed by the data storage device controller 120 described herein may be performed by another device that connects to the data storage device 102.

The data storage device 102 and the host device 150 may be operationally coupled via a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 via the communication path 110, such as a wired communication path and/or a wireless communication path. For example, the data storage device 102 may include an interface 108 (e.g., a host interface) that enables communication via the communication path 110 between the data storage device 102 and the host device 150, such as when the interface 108 is communicatively coupled to the host device 150.

The host device 150 may include an electronic processor and a memory. The memory may be configured to store data and/or instructions that may be executable by the electronic processor. The memory may be a single memory or may include one or more memories, such as one or more non-volatile memories, one or more volatile memories, or a combination thereof. The host device 150 may issue one or more commands to the data storage device 102, such as one or more requests to erase data at, read data from, or write data to the memory 104 of the data storage device 102. Additionally, the host device 150 may issue one or more vendor specific commands to the data storage device 102 to notify and/or configure the data storage device 102. For example, the host device 150 may be configured to provide data, such as user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates via a memory interface that enables reading from the memory 104 and writing to the memory 104. In some examples, the host device 150 may operate in compliance with an industry specification, a Secure Digital (SD) Host Controller specification, or other suitable industry specification. The host device 150 may also communicate with the memory 104 in accordance with any other suitable communication protocol.

The memory 104 of the data storage device 102 may include a non-volatile memory (e.g., NAND, NOR, 3D NAND family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (e.g., one or more erase blocks). Each block may include one or more groups of storage elements, such as a representative group of storage elements 107A-107N. The group of storage elements 107A-107N may be configured as a word line. The group of storage elements 107 may include multiple storage elements, such as a representative storage elements 109A and 109N, respectively.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The data storage device 102 includes the data storage device controller 120 coupled to the memory 104 (e.g., the one or more memory dies 103) via a bus 106, an interface (e.g., interface circuitry), another structure, or a combination thereof. For example, the bus 106 may include multiple distinct channels to enable the data storage device controller 120 to communicate with each of the one or more memory dies 103 in parallel with, and independently of, communication with the other memory dies 103. In some implementations, the memory 104 may be a flash memory.

The data storage device controller 120 is configured to receive data and instructions from the host device 150 and to send data to the host device 150. For example, the data storage device controller 120 may send data to the host device 150 via the interface 108, and the data storage device controller 120 may receive data from the host device 150 via the interface 108. The data storage device controller 120 is configured to send data and commands (e.g., the memory operation 136) to the memory 104 and to receive data from the memory 104. For example, the data storage device controller 120 is configured to send data and a write command to cause the memory 104 to store data to a specified address of the memory 104. The write command may specify a physical address of a portion of the memory 104 (e.g., a physical address of a word line of the memory 104) that is to store the data, as well as a size (for example, 2 k, 4 k, etc.) of the data to be written.

The data storage device controller 120 is configured to send a read command to the memory 104 to access data from a specified address of the memory 104. The read command may specify the physical address of a region of the memory 104 (e.g., a physical address of a word line of the memory 104). The data storage device controller 120 may also be configured to send data and commands to the memory 104 associated with background scanning operations, garbage collection operations, and/or wear-leveling operations, or other suitable memory operations.

The data storage device controller 120 may include a memory 124 (for example, a random access memory ("RAM"), a read-only memory ("ROM"), a non-transitory computer readable medium, or a combination thereof) and an electronic processor 128 (for example, a microprocessor, a microcontroller, a field-programmable gate array ("FPGA") semiconductor, an application specific integrated circuit ("ASIC"), or another suitable programmable device). The memory 124 stores data and/or instructions that may be executable by the electronic processor 128. In particular, the memory 124 stores a linked XOR flash data protection scheme 126 as described in greater detail with respect to FIGS. 2-7.

Additionally, although the data storage device controller 120 is illustrated in FIG. 1 as including the memory 124, in other implementations, some or all of the memory 124 is instead located separate from the data storage device controller 120 and executable by the electronic processor 128 or a different electronic processor that is external to the data storage device controller 120 and/or the data storage device 102. For example, the memory 124 may be dynamic random-access memory (DRAM) that is separate and distinct from the data storage device controller 120. As a result, operations that would normally be performed solely by the data storage device controller 120 described herein may be performed by the following: 1) the electronic processor 128 and different memory that is internal to the data storage device 102, 2) the electronic processor 128 and different memory that is external to the data storage device 102, 3) a different electronic processor that is external to the data storage device controller 120 and in communication with memory of the data storage device 102, and 4) a different electronic processor that is external to the data storage device controller 120 and in communication with memory that is external to the data storage device 102.

The data storage device controller 120 may send the memory operation 136 (e.g., a read command) to the memory 104 to cause the read/write circuitry 140 to sense data stored in a storage element. For example, the data storage device controller 120 may send the read command to the memory 104 in response to receiving a request for read access from the host device 150.

Figure 2:
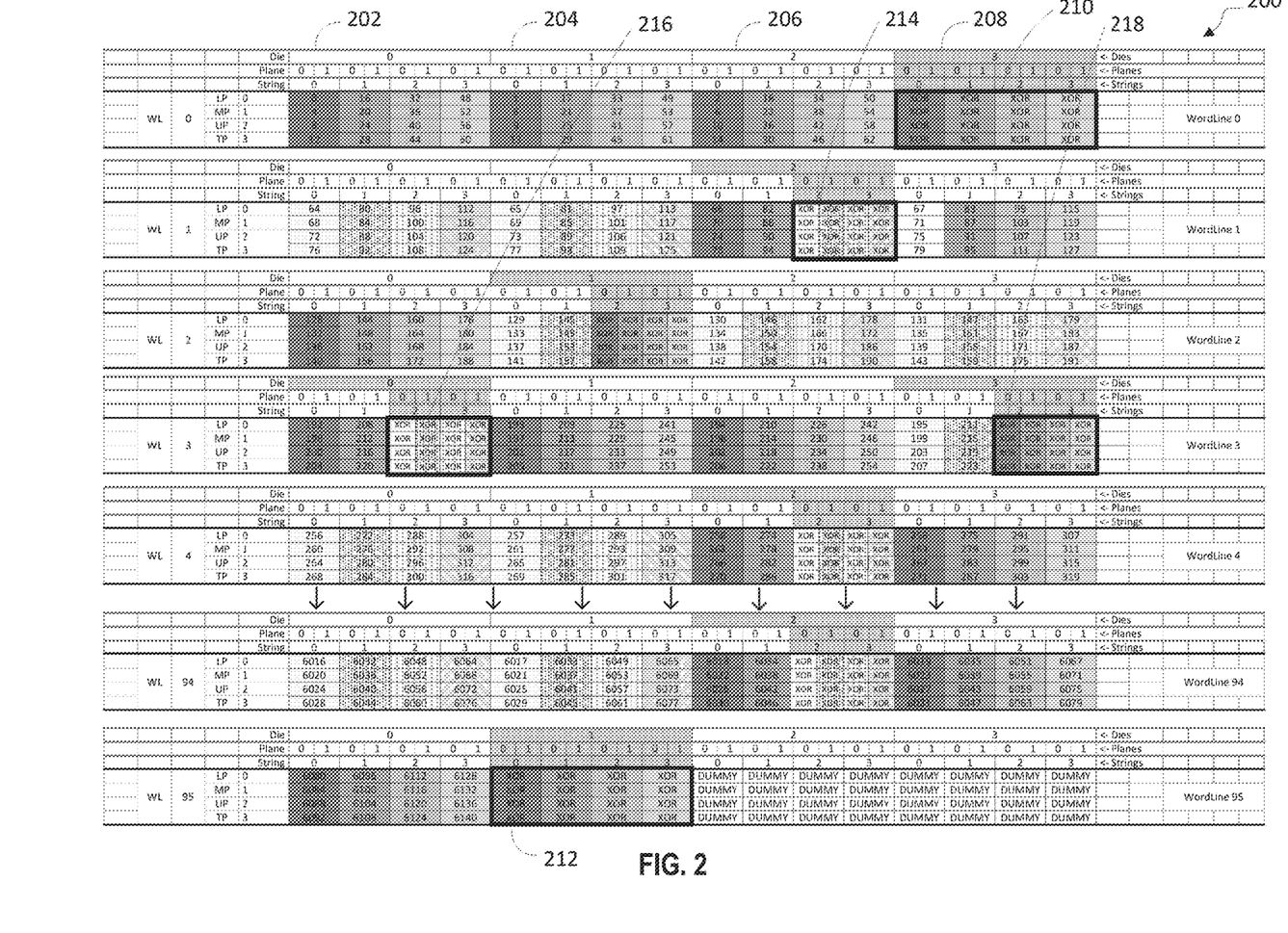
FIG. 2 is a table illustrating an example with Flash jumbo-block composed of four die-blocks, in accordance with some embodiments of the present disclosure.

As noted above, embodiments described herein provide a linked XOR flash data protection scheme for data storage devices (for example, the linked XOR flash data protection scheme 126). The linked XOR data protection scheme 126 described herein will be described with reference to FIGS. 2-7. FIG. 2 is a table illustrating an example with Flash jumbo-block 200 composed of four die-blocks 202-208, in accordance with some embodiments of the present disclosure. In the illustrated example, each the four die blocks 202-208 has two planes and ninety-six word lines, with four strings per word line and four pages (for example, a lower page, a middle page, an upper page, and a top page) per string. In FIG. 2, the number in "page" shows programming order to the Flash jumbo-block 200. The colors are used to highlight flash data belonging to certain XOR parity bin groups. There are four XOR parity bin groups that matches the number of strings. There are four XOR parity buffers in every XOR parity bin group that matches the number of pages per string. The XOR parity buffer size during the accumulation period is matching the die-page size.

In some embodiments, the XOR parity buffer size stored in the Flash jumbo-block 200 in every word line varies between either "full" or "reduced." As one example, in some embodiments, the XOR parity buffer size is full (same as during the accumulation, and referred to as "full XOR parity buffer") for starting and ending word lines of a segment of flash jumbo-block (for example, for first and last XOR zone from XOR zone groups). As another example, in some embodiments, the XOR parity buffer size is reduced (for example, to the size of a single plane-page, and referred to as "reduced XOR parity buffer") for all of the word lines except those where it is full. The reduction may be performed by XOR-ing the plane-parts of the accumulation XOR buffer together.

In the example of FIG. 2, wordline 0 has a full XOR parity buffer 210 and wordline 95 has a full XOR parity buffer 212. In some examples, wordlines 1-94 may each include one or more reduced XOR parity buffers. For example, in FIG. 2, wordline 1 includes reduced XOR parity buffer 214 and wordline 3 includes reduced XOR parity buffers 216 and 218.

When a defect occurs between the full XOR parity buffers 210 and 212, the full XOR parity buffers 210 and 212 may be seeded with the other reduced XOR parity buffers until the reduced XOR parity buffer closest to the defect may be used to correct the defect. However, the correction of a defect in wordline 47 would require an overhead with respect to recovery time.

To minimize recovery time, XOR zone groups may be used to divide flash jumbo-block space into several segments that are isolated. For example, instead of a reduced XOR parity buffer at wordline 47, wordline 47 may include a full XOR parity buffer that may be used to immediately correct the defect at wordline 47 without the need to seed from another full XOR parity buffer. Additionally, the full XOR parity buffer at wordline 47 would reduce the recovery time for correcting defects between wordlines 1-46 and wordlines 48-94. However, the full XOR parity buffer is larger in size than the reduced XOR parity buffer. Therefore, the XOR zone groups may provide a level of control over worst case recovery time at the expense of additional flash jumbo-block space spent on defining two or more XOR zone groups.

One of the features of the proposed scheme described herein is "negative die rotation" that changes the die index storing XOR parity in a current word line (for example, an XOR Zone) to die index minus 1 (or changing it back maximal index if current value is 0) in next word line (for example, a XOR Zone) as defined below by Expression (1).

$$\text{parityDieIdx\_next} = \text{mod}(\text{parityDieIdx\_cur} + \text{dieCount} - 1, \text{dieCount}) \quad (1)$$

In some embodiments, the linking concept of the proposed scheme includes the use of an XOR parity buffer before it goes through a reduction step as a starting XOR accumulation buffer for the next XOR Zone. Since the example illustrated in FIG. 2 has 16 XOR parity buffers, there are 16 links done on the XOR Zone boundary.

Example use cases detailing the accumulation process includes, for example, an XOR zones overlap case, an XOR zone no-overlap case, and a final XOR zone case.

With reference to FIG. 2, an example XOR zone overlap case includes an XOR parity buffer stored in a second wordline 2 of a first die, a first plane and a second string at a middle page. For example, a pre-reduction plane #1 string #2 middle page XOR parity buffer from the previous XOR Zone (for example, that has its reduced XOR parity buffers saved in die #2 word line #1), where this buffer is not explicitly stored to the Flash jumbo-block 200. As illustrated in FIG. 2, flash data buffers with the following programming indices: 86, 87 and 148. These Flash data buffers are XOR'ed together over the planes dimension.

With reference to FIG. 2, an example XOR zone no-overlap case includes an XOR parity buffer stored in word line #3 of die #0 plane #1 string #3 middle page that includes the following pages: (1) Pre-reduction plane #1 string #3 middle page XOR parity buffer from the previous XOR Zone (that has its reduced XOR parity buffers saved in die #1 word line #2), where this buffer is not explicitly stored to the Flash jumbo-block 200, and (2) Flash data buffers with the following programming indices: 182 and 183, where these Flash data buffers are XOR'ed together over the planes dimension.

With reference to FIG. 2, an example final XOR zone case includes an XOR parity buffer stored in word line #95 of die #1 string #1 middle page that includes the following pages: (1) Pre-reduction plane #0 and plane #1 string #1 middle page XOR parity buffer from the previous XOR Zone (that has its reduced XOR parity buffers saved in die #2 word line #94), where this buffer is not explicitly stored to Flash jumbo-block, and (2) flash data buffers with the following programming indices: 6038, 6039 and 6100.

In some embodiments, the flash data recovery algorithm depends on the corruption pattern and can fall into two categories. A first category includes recovery actions limited to a scope of a single XOR zone bin, where the Flash data is corrupted. This is used to recover from single plane page corruption in one or more word lines based on re-accumulating full (in uncorrupted plane(s)) and partial (in corrupted plane) XOR parity buffers and subtracting them from reduced XOR parity buffer stored in flash block. A second category includes recovery actions that extend beyond the scope of affected XOR zone bin involving all the following XOR zones up to the end of XOR zones group and the XOR zone that precedes the affected one. This is used to recover from die page corruption in one word line or single plane failure across all word lines with NPD for all planes in one word line. The algorithm is based: (a) on ascending linked XOR parity buffers starting from the final XOR zone "up" to the one affected with die page failure and (b) on descending starting accumulation XOR buffer from the XOR zones that precedes the one affected with die page failure.

The NPD wordline has to receive missing XOR parity buffer components from the first XOR Zone of the group—this is descending accumulation. Additionally, the same NPD wordline has to receive another missing XOR parity buffer components from the last XOR Zone of the group that is holding full parity—this is ascending accumulation. In order for NPD recovery to be supported in the first XOR zone in the group, the first XOR zone has to have full parity—basically, NPD can be recovered in any WL only if both the first and the last XOR zones in the group have full parity.

Figure 3:
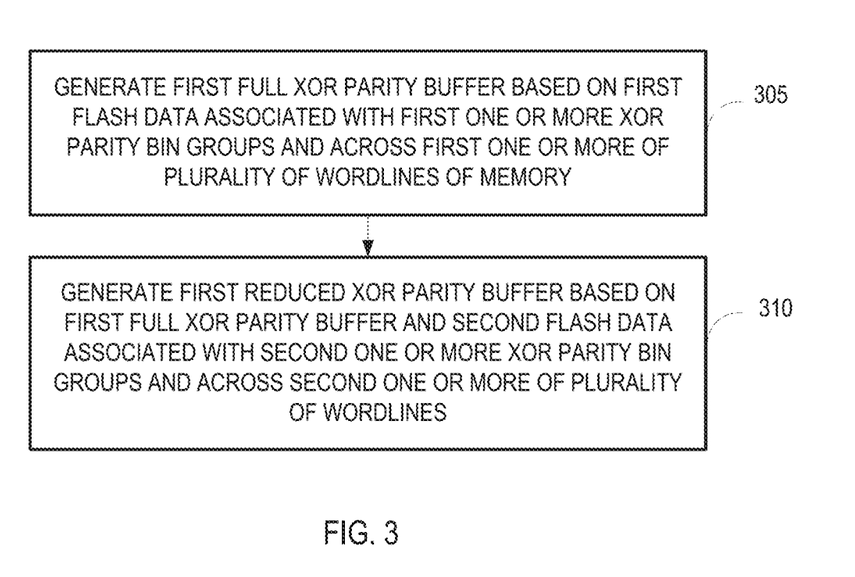
FIGS. 3-7 are flowcharts illustrating methods 300-700 that perform different aspects of the linked XOR flash data protection scheme 126 1, in accordance with some embodiments of the present disclosure.

FIGS. 3-7 are flowcharts illustrating methods 300-700 that perform different aspects of the linked XOR flash data protection scheme 126 1, in accordance with some embodiments of the present disclosure. As illustrated in FIG. 3, the method 300 includes generating, with a data storage controller, a first full XOR parity buffer based on first flash data associated with a first one or more XOR parity bin groups and across a first one or more of a plurality of wordlines of a memory (at block 305). For example, the data storage controller 120 generates the full XOR parity buffer 210 based on flash data associated with four XOR parity bin groups and across wordline 0, the four XOR parity bin groups across wordline 0 represent a first XOR zone. The first XOR zone must have a full XOR parity buffer to ensure recovery of an NPD in the first XOR zone.

The method 300 also includes generating, with the data storage controller, a first reduced XOR parity buffer based on the first full XOR parity buffer and second flash data associated with a second one or more XOR parity bin groups and across a second one or more of the plurality of wordlines (at block 310). The first reduced XOR parity buffer is smaller in size than the first full XOR parity buffer. For example, the data storage controller 120 generates the reduced XOR parity buffer 214 based on flash data associated with four XOR parity bin groups and across wordline 1, the four XOR parity bin groups across wordline 1 represent XOR zone 2.

Figure 4:
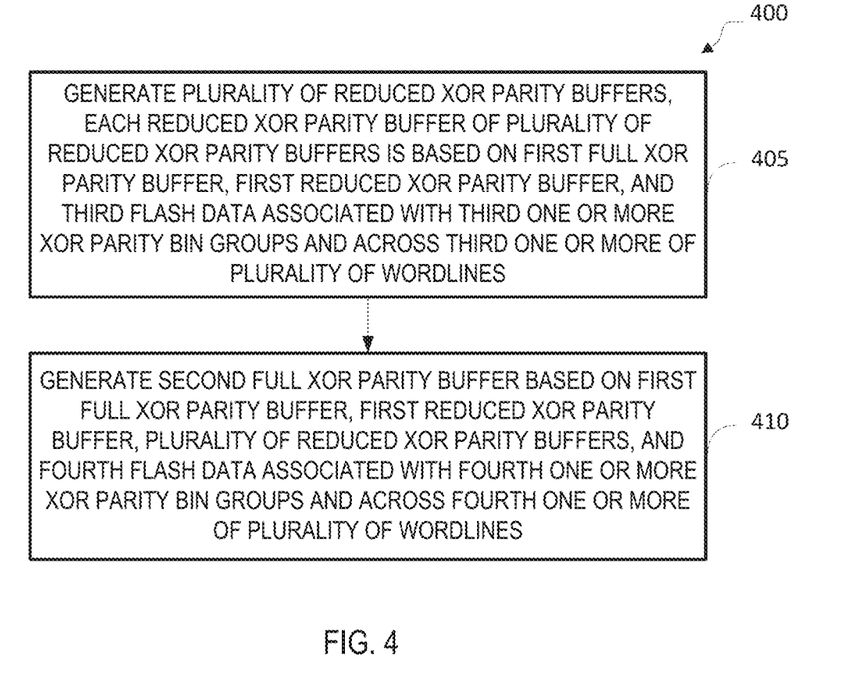

A method 400 is an extension of the method 300. As illustrated in FIG. 4, the method 400 includes generating a plurality of reduced XOR parity buffers, each reduced XOR parity buffer of the plurality of reduced XOR parity buffers is based on the first full XOR parity buffer, the first reduced XOR parity buffer, and third flash data associated with a third one or more XOR parity bin groups and across a third one or more of the plurality of wordlines (at block 405). For example, the data storage controller 120 generates reduced XOR parity buffers 216 and 218 based on flash data associated with different four XOR parity bin groups and across wordlines 2 and 3, the different four XOR parity bin groups across wordlines 2 and 3 represent XOR zones 3 and 4.

The method 400 also includes generating a second full XOR parity buffer based on the first full XOR parity buffer, the first reduced XOR parity buffer, the plurality of reduced XOR parity buffers, and fourth flash data associated with a fourth one or more XOR parity bin groups and across a fourth one or more of the plurality of wordlines (at block 410). Each XOR parity buffer of the first reduced XOR parity buffer and the plurality of reduced XOR parity buffers is individually smaller in size than the first full XOR parity buffer and the second full XOR parity buffer. For example, the data storage controller 120 generates the full XOR parity buffer 212 based on flash data associated with four XOR parity bin groups and across wordline 95, the four XOR parity bin groups across wordline 95 represent XOR zone 96.

In some examples, the method 400 further includes controlling a memory to store the first full XOR parity buffer in one of the first one or more of the plurality of wordlines, controlling the memory to store the first reduced XOR parity buffer in one of the second one or more of the plurality of wordlines, controlling the memory to store the plurality of reduced XOR parity buffers in one of the third one or more of the plurality of wordlines, and controlling the memory to store the second full XOR parity buffer in one of the fourth one or more of the plurality of wordlines.

Additionally, in some examples, with respect to the method 400, the one of the first one or more of the plurality of wordlines is a first wordline. The one of the second one or more of the plurality of wordlines is a second wordline. The one of the fourth one or more of the plurality of wordlines is a last wordline. The one of the third one or more of the plurality of wordlines is a wordline between the second wordline and the last wordline.

Figure 5:
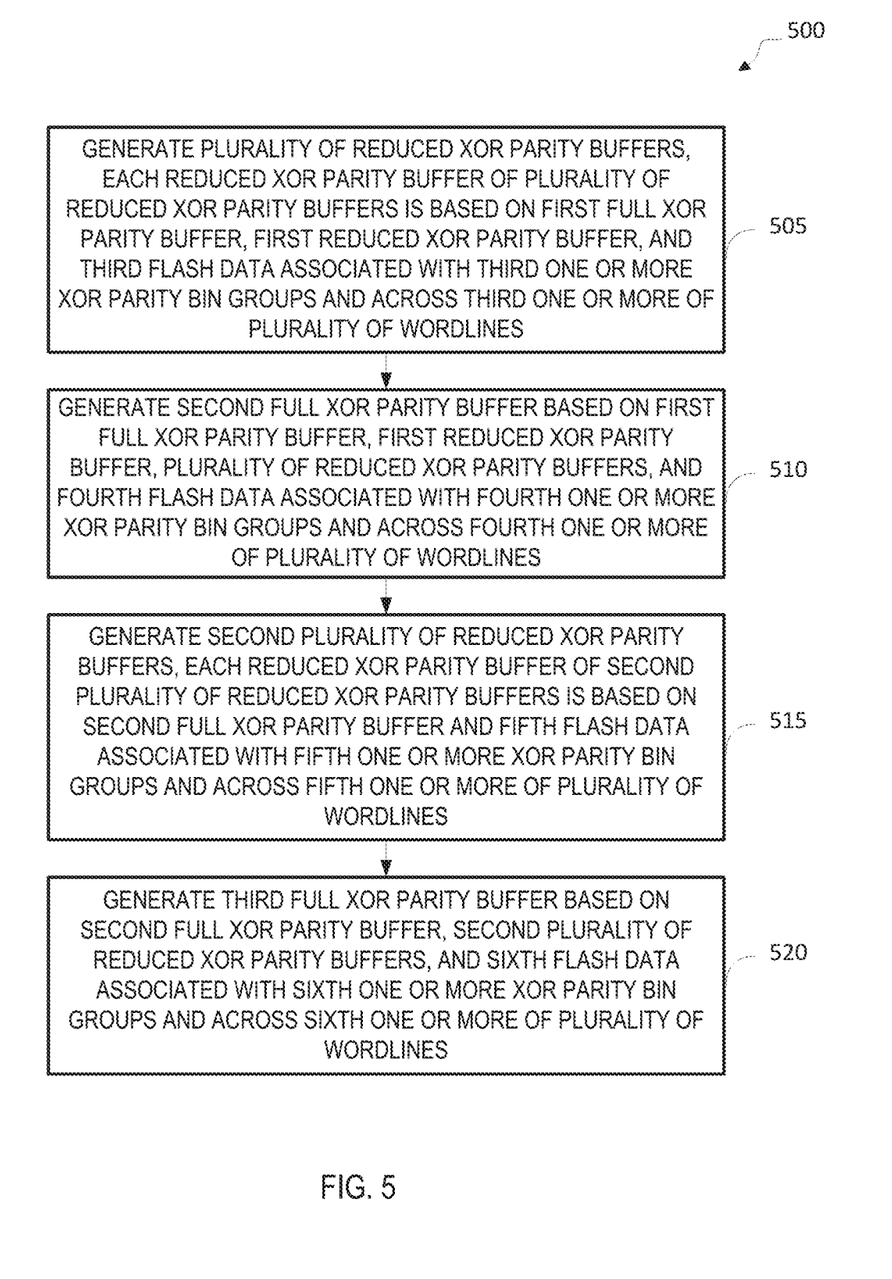

A method 500 is an extension of the method 300. As illustrated in FIG. 5, the method 500 includes generating a plurality of reduced XOR parity buffers, each reduced XOR parity buffer of the plurality of reduced XOR parity buffers is based on the first full XOR parity buffer, the first reduced XOR parity buffer, and third flash data associated with a third one or more XOR parity bin groups and across a third one or more of the plurality of wordlines (at block 505). For example, the data storage controller 120 generates reduced XOR parity buffers based on flash data associated with different four XOR parity bin groups and across wordlines 2-46.

The method 500 includes generating a second full XOR parity buffer based on the first full XOR parity buffer, the first reduced XOR parity buffer, the plurality of reduced XOR parity buffers, and fourth flash data associated with a fourth one or more XOR parity bin groups and across a fourth one or more of the plurality of wordlines (at block 510). For example, the data storage controller 120 generates a full XOR parity buffer based on flash data associated with four XOR parity bin groups and across wordline 47.

The method 500 includes generating a second plurality of reduced XOR parity buffers, each reduced XOR parity buffer of the second plurality of reduced XOR parity buffers is based on the second full XOR parity buffer and fifth flash data associated with a fifth one or more XOR parity bin groups and across a fifth one or more of the plurality of wordlines (at block 515). For example, the data storage controller 120 generates reduced XOR parity buffers based on flash data associated with different four XOR parity bin groups and across wordlines 48-94.

The method 500 also includes generating a third full XOR parity buffer based on the second full XOR parity buffer, the second plurality of reduced XOR parity buffers, and sixth flash data associated with a sixth one or more XOR parity bin groups and across a sixth one or more of the plurality of wordlines (at block 520). Each XOR parity buffer of the first reduced XOR parity buffer, the plurality of reduced XOR parity buffers, and the second plurality of reduced XOR parity buffers is individually smaller in size than the first full XOR parity buffer, the second full XOR parity buffer, and the third full XOR parity buffer. For example, the data storage controller 120 generates the full XOR parity buffer 212 based on flash data associated with four XOR parity bin groups and across wordline 95.

In some examples, the method 500 further includes controlling a memory to store the first full XOR parity buffer in one of the first one or more of the plurality of wordlines, controlling the memory to store the first reduced XOR parity buffer in one of the second one or more of the plurality of wordlines, controlling the memory to store the plurality of reduced XOR parity buffers in one of the third one or more of the plurality of wordlines, controlling the memory to store the second full XOR parity buffer in one of the fourth one or more of the plurality of wordlines, controlling the memory to store the second plurality of reduced XOR parity buffers in one of the fifth one or more of the plurality of wordlines, and controlling the memory to store the third full XOR parity buffer in one of the sixth one or more of the plurality of wordlines.

Additionally, in some examples, with respect to the method 500, the one of the first one or more of the plurality of wordlines is a first wordline. The one of the second one or more of the plurality of wordlines is a second wordline. The one of the fourth one or more of the plurality of wordlines is a middle wordline between the first wordline and a last wordline of the plurality of wordlines. The one of the third one or more of the plurality of wordlines is each wordline between the second wordline and the middle wordline. The one of the sixth one or more of the plurality of wordlines is the last wordline. The one of the fifth one or more of the plurality of wordlines is a wordline between the middle wordline and the last wordline.

Figure 6:
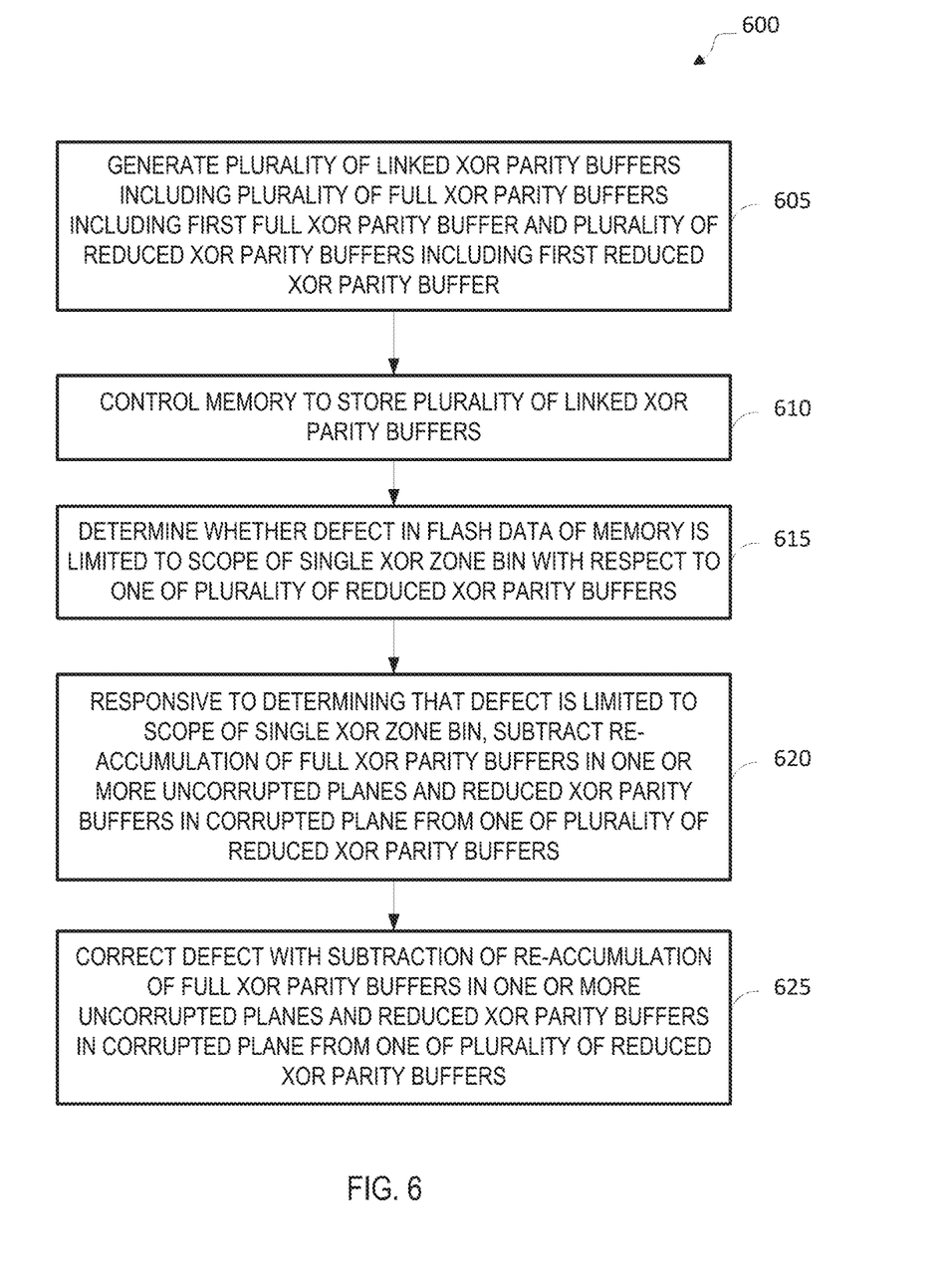

A method 600 is an extension of the method 300. The method 600 includes generating a plurality of linked XOR parity buffers including a plurality of full XOR parity buffers including the first full XOR parity buffer and a plurality of reduced XOR parity buffers including the first reduced XOR parity buffer (at block 605). For example, the data storage controller 120 generates the full XOR parity buffer 210 based on flash data associated with four XOR parity bin groups and across wordline 0 and the reduced XOR parity buffer 214 based on flash data associated with four XOR parity bin groups and across wordline 1.

The method 600 includes controlling a memory to store the plurality of linked XOR parity buffers (at block 610). For example, the data storage controller 120 controls the memory 104 to store the plurality of linked XOR parity buffers to provide recoverability of flash data stored in the memory 104.

The method 600 includes determining whether a defect in flash data of the memory is limited to a scope of a single XOR zone bin with respect to one of the plurality of reduced XOR parity buffers (at block 615). For example, the data storage controller 120 determines whether a defect in flash data of the memory 104 is limited to a scope of a single XOR zone bin with respect to one of the plurality of reduced XOR parity buffers.

The method 600 includes responsive to determining that the defect is limited to the scope of the single XOR zone bin, subtracting a re-accumulation of full XOR parity buffers in one or more uncorrupted planes and reduced XOR parity buffers in a corrupted plane from the one of the plurality of reduced XOR parity buffers (at block 620). For example, the data storage controller 120 subtracts a re-accumulation of full XOR parity buffers in one or more uncorrupted planes and reduced XOR parity buffers in a corrupted plane from the one of the plurality of reduced XOR parity buffers in response to determining that the defect is limited to the scope of the single XOR zone bin.

The method 600 also includes correcting the defect with the subtraction of the re-accumulation of the full XOR parity buffers in the one or more uncorrupted planes and the reduced XOR parity buffers in the corrupted plane from the one of the plurality of reduced XOR parity buffers (at block 625). For example, the data storage controller 120 corrects the defect with the subtraction of the re-accumulation of the full XOR parity buffers in the one or more uncorrupted planes and the reduced XOR parity buffers in the corrupted plane from the one of the plurality of reduced XOR parity buffers.

Figure 7:
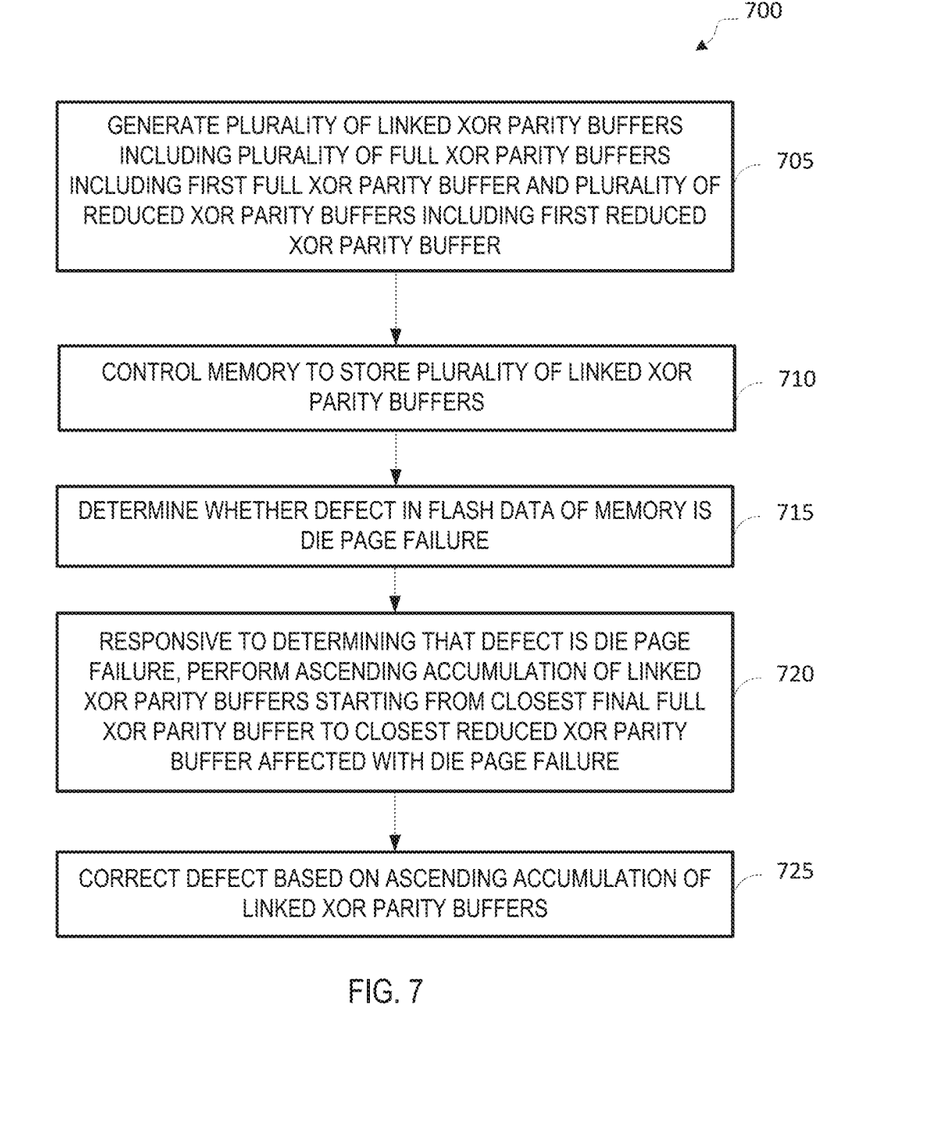

A method 700 is an extension of the method 300. The method 700 includes generating a plurality of linked XOR parity buffers including a plurality of full XOR parity buffers including the first full XOR parity buffer and a plurality of reduced XOR parity buffers including the first reduced XOR parity buffer (at block 705). For example, the data storage controller 120 generates the full XOR parity buffer 210 based on flash data associated with four XOR parity bin groups and across wordline 0 and the reduced XOR parity buffer 214 based on flash data associated with four XOR parity bin groups and across wordline 1.

The method 700 includes controlling a memory to store the plurality of linked XOR parity buffers (at block 710). For example, the data storage controller 120 controls the memory 104 to store the plurality of linked XOR parity buffers to provide recoverability of flash data stored in the memory 104.

The method 700 includes determining whether a defect in flash data of the memory is a die page failure (at block 715). For example, the data storage controller 120 determines whether a defect in flash data of the memory is a die page failure.

The method 700 includes responsive to determining that the defect is the die page failure, performing ascending accumulation of linked XOR parity buffers starting from a closest final full XOR parity buffer to a closest reduced XOR parity buffer affected with the die page failure (at block 720). For example, the data storage controller 120 performing ascending accumulation of linked XOR parity buffers starting from a closest final full XOR parity buffer to a closest reduced XOR parity buffer affected with the die page failure in response to determining that the defect is the die page failure.

The method 700 also includes correcting the defect based on the ascending accumulation of linked XOR parity buffers (at block 725). For example, the data storage controller 120 corrects the defect based on the ascending accumulation of the linked XOR parity buffers.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a memory including a plurality of wordlines;
a data storage controller including data storage controller memory with a linked XOR flash data protection scheme, the data storage controller coupled to the memory; and
a bus for transferring data between the data storage controller and a host device in communication with the data storage controller,
wherein, when executing the linked XOR flash data protection scheme, the data storage controller is configured to:
generate a first full XOR parity buffer based on first flash data associated with a first one or more XOR parity bin groups and across a first one or more of the plurality of wordlines, and
generate a first reduced XOR parity buffer based on the first full XOR parity buffer and second flash data associated with a second one or more XOR parity bin groups and across a second one or more of the plurality of wordlines,
wherein the first reduced XOR parity buffer is smaller in size than the first full XOR parity buffer.

2. The data storage device of claim 1, wherein, when executing the linked XOR flash data protection scheme, the data storage controller is further configured to:
generate a plurality of reduced XOR parity buffers, each reduced XOR parity buffer of the plurality of reduced XOR parity buffers is based on the first full XOR parity buffer, the first reduced XOR parity buffer, and third flash data associated with a third one or more XOR parity bin groups and across a third one or more of the plurality of wordlines, and
generate a second full XOR parity buffer based on the first full XOR parity buffer, the first reduced XOR parity buffer, the plurality of reduced XOR parity buffers, and fourth flash data associated with a fourth one or more XOR parity bin groups and across a fourth one or more of the plurality of wordlines.

3. The data storage device of claim 2, wherein, when executing the linked XOR flash data protection scheme, the data storage controller is further configured to:
control the memory to store the first full XOR parity buffer in one of the first one or more of the plurality of wordlines,
control the memory to store the first reduced XOR parity buffer in one of the second one or more of the plurality of wordlines,
control the memory to store the plurality of reduced XOR parity buffers in one of the third one or more of the plurality of wordlines, and
control the memory to store the second full XOR parity buffer in one of the fourth one or more of the plurality of wordlines.

4. The data storage device of claim 3, wherein the one of the first one or more of the plurality of wordlines is a first wordline, wherein the one of the second one or more of the plurality of wordlines is a second wordline, wherein the one of the fourth one or more of the plurality of wordlines is a last wordline, and wherein the one of the third one or more of the plurality of wordlines is a wordline between the second wordline and the last wordline.

5. The data storage device of claim 1, wherein, when executing the linked XOR flash data protection scheme, the data storage controller is further configured to:
generate a plurality of reduced XOR parity buffers, each reduced XOR parity buffer of the plurality of reduced XOR parity buffers is based on the first full XOR parity buffer, the first reduced XOR parity buffer, and third flash data associated with a third one or more XOR parity bin groups and across a third one or more of the plurality of wordlines,
generate a second full XOR parity buffer based on the first full XOR parity buffer, the first reduced XOR parity buffer, the plurality of reduced XOR parity buffers, and fourth flash data associated with a fourth one or more XOR parity bin groups and across a fourth one or more of the plurality of wordlines,
generate a second plurality of reduced XOR parity buffers, each reduced XOR parity buffer of the second plurality of reduced XOR parity buffers is based on the second full XOR parity buffer and fifth flash data associated with a fifth one or more XOR parity bin groups and across a fifth one or more of the plurality of wordlines, and
generate a third full XOR parity buffer based on the second full XOR parity buffer, the second plurality of reduced XOR parity buffers, and sixth flash data associated with a sixth one or more XOR parity bin groups and across a sixth one or more of the plurality of wordlines.

6. The data storage device of claim 5, wherein, when executing the linked XOR flash data protection scheme, the data storage controller is further configured to:
control the memory to store the first full XOR parity buffer in one of the first one or more of the plurality of wordlines,
control the memory to store the first reduced XOR parity buffer in one of the second one or more of the plurality of wordlines,
control the memory to store the plurality of reduced XOR parity buffers in one of the third one or more of the plurality of wordlines,
control the memory to store the second full XOR parity buffer in one of the fourth one or more of the plurality of wordlines,
control the memory to store the second plurality of reduced XOR parity buffers in one of the fifth one or more of the plurality of wordlines, and
control the memory to store the third full XOR parity buffer in one of the sixth one or more of the plurality of wordlines.

7. The data storage device of claim 3, wherein the one of the first one or more of the plurality of wordlines is a first wordline, wherein the one of the second one or more of the plurality of wordlines is a second wordline, wherein the one of the fourth one or more of the plurality of wordlines is a middle wordline between the first wordline and a last wordline of the plurality of wordlines, wherein the one of the third one or more of the plurality of wordlines is each wordline between the second wordline and the middle wordline, wherein the one of the sixth one or more of the plurality of wordlines is the last wordline, and wherein the one of the fifth one or more of the plurality of wordlines is a wordline between the middle wordline and the last wordline.

8. The data storage device of claim 1, wherein, when executing the linked XOR flash data protection scheme, the data storage controller is further configured to:
generate a plurality of linked XOR parity buffers including a plurality of full XOR parity buffers including the first full XOR parity buffer and a plurality of reduced XOR parity buffers including the first reduced XOR parity buffer,
control a memory to store the plurality of linked XOR parity buffers,
determine whether a defect in flash data of the memory is limited to a scope of a single XOR zone bin with respect to one of the plurality of reduced XOR parity buffers, and
responsive to determining that the defect is limited to the scope of the single XOR zone bin, subtracting a re-accumulation of full XOR parity buffers in one or more uncorrupted planes and reduced XOR parity buffers in a corrupted plane from the one of the plurality of reduced XOR parity buffers, and
correct the defect with the subtraction of the re-accumulation of the full XOR parity buffers in the one or more uncorrupted planes and the reduced XOR parity buffers in the corrupted plane from the one of the plurality of reduced XOR parity buffers.

9. The data storage device of claim 1, wherein, when executing the linked XOR flash data protection scheme, the data storage controller is further configured to:

generate a plurality of linked XOR parity buffers including a plurality of full XOR parity buffers including the first full XOR parity buffer and a plurality of reduced XOR parity buffers including the first reduced XOR parity buffer,
control a memory to store the plurality of linked XOR parity buffers,
determine whether a defect in flash data of the memory is a die page failure, and
responsive to determining that the defect is the die page failure, ascending accumulation of linked XOR parity buffers starting from a closest final full XOR parity buffer to a closest reduced XOR parity buffer affected with the die page failure, and
correct the defect based on the ascending accumulation of the linked XOR parity buffers.

10. A method comprising:
generating, with a data storage controller, a first full XOR parity buffer based on first flash data associated with a first one or more XOR parity bin groups and across a first one or more of a plurality of wordlines of a memory; and
generating, with the data storage controller, a first reduced XOR parity buffer based on the first full XOR parity buffer and second flash data associated with a second one or more XOR parity bin groups and across a second one or more of the plurality of wordlines,
wherein the first reduced XOR parity buffer is smaller in size than the first full XOR parity buffer.

11. The method of claim 10, further comprising:
generating a plurality of reduced XOR parity buffers, each reduced XOR parity buffer of the plurality of reduced XOR parity buffers is based on the first full XOR parity buffer, the first reduced XOR parity buffer, and third flash data associated with a third one or more XOR parity bin groups and across a third one or more of the plurality of wordlines; and
generating a second full XOR parity buffer based on the first full XOR parity buffer, the first reduced XOR parity buffer, the plurality of reduced XOR parity buffers, and fourth flash data associated with a fourth one or more XOR parity bin groups and across a fourth one or more of the plurality of wordlines.

12. The method of claim 11, further comprising:
controlling a memory to store the first full XOR parity buffer in one of the first one or more of the plurality of wordlines;
controlling the memory to store the first reduced XOR parity buffer in one of the second one or more of the plurality of wordlines;
controlling the memory to store the plurality of reduced XOR parity buffers in one of the third one or more of the plurality of wordlines; and
controlling the memory to store the second full XOR parity buffer in one of the fourth one or more of the plurality of wordlines.

13. The method of claim 12, wherein the one of the first one or more of the plurality of wordlines is a first wordline, wherein the one of the second one or more of the plurality of wordlines is a second wordline, wherein the one of the fourth one or more of the plurality of wordlines is a last wordline, and wherein the one of the third one or more of the plurality of wordlines is a wordline between the second wordline and the last wordline.

14. The method of claim 10, further comprising:
generating a plurality of reduced XOR parity buffers, each reduced XOR parity buffer of the plurality of reduced XOR parity buffers is based on the first full XOR parity buffer, the first reduced XOR parity buffer, and third flash data associated with a third one or more XOR parity bin groups and across a third one or more of the plurality of wordlines;

generating a second full XOR parity buffer based on the first full XOR parity buffer, the first reduced XOR parity buffer, the plurality of reduced XOR parity buffers, and fourth flash data associated with a fourth one or more XOR parity bin groups and across a fourth one or more of the plurality of wordlines;

generating a second plurality of reduced XOR parity buffers, each reduced XOR parity buffer of the second plurality of reduced XOR parity buffers is based on the second full XOR parity buffer and fifth flash data associated with a fifth one or more XOR parity bin groups and across a fifth one or more of the plurality of wordlines; and generating a third full XOR parity buffer based on the second full XOR parity buffer, the second plurality of reduced XOR parity buffers, and sixth flash data associated with a sixth one or more XOR parity bin groups and across a sixth one or more of the plurality of wordlines.

15. The method of claim 14, further comprising:
controlling a memory to store the first full XOR parity buffer in one of the first one or more of the plurality of wordlines;
controlling the memory to store the first reduced XOR parity buffer in one of the second one or more of the plurality of wordlines;
controlling the memory to store the plurality of reduced XOR parity buffers in one of the third one or more of the plurality of wordlines;
controlling the memory to store the second full XOR parity buffer in one of the fourth one or more of the plurality of wordlines;
controlling the memory to store the second plurality of reduced XOR parity buffers in one of the fifth one or more of the plurality of wordlines; and
controlling the memory to store the third full XOR parity buffer in one of the sixth one or more of the plurality of wordlines.

16. The method of claim 12, wherein the one of the first one or more of the plurality of wordlines is a first wordline, wherein the one of the second one or more of the plurality of wordlines is a second wordline, wherein the one of the fourth one or more of the plurality of wordlines is a middle wordline between the first wordline and a last wordline of the plurality of wordlines, wherein the one of the third one or more of the plurality of wordlines is each wordline between the second wordline and the middle wordline, wherein the one of the sixth one or more of the plurality of wordlines is the last wordline, and wherein the one of the fifth one or more of the plurality of wordlines is a wordline between the middle wordline and the last wordline.

17. The method of claim 10, further comprising:
generating a plurality of linked XOR parity buffers including a plurality of full XOR parity buffers including the first full XOR parity buffer and a plurality of reduced XOR parity buffers including the first reduced XOR parity buffer;
controlling a memory to store the plurality of linked XOR parity buffers;
determining whether a defect in flash data of the memory is limited to a scope of a single XOR zone bin with respect to one of the plurality of reduced XOR parity buffers; and
responsive to determining that the defect is limited to the scope of the single XOR zone bin, subtracting a re-accumulation of full XOR parity buffers in one or more uncorrupted planes and reduced XOR parity buffers in a corrupted plane from the one of the plurality of reduced XOR parity buffers; and
correcting the defect with the subtraction of the re-accumulation of the full XOR parity buffers in the one or more uncorrupted planes and the reduced XOR parity buffers in the corrupted plane from the one of the plurality of reduced XOR parity buffers.

18. The method of claim 10, wherein, when executing the linked XOR flash data protection scheme, the data storage controller is further configured to:
generating a plurality of linked XOR parity buffers including a plurality of full XOR parity buffers including the first full XOR parity buffer and a plurality of reduced XOR parity buffers including the first reduced XOR parity buffer;
controlling a memory to store the plurality of linked XOR parity buffers;
determining whether a defect in flash data of the memory is a die page failure; and
responsive to determining that the defect is the die page failure, performing ascending accumulation of linked XOR parity buffers starting from a closest final full XOR parity buffer to a closest reduced XOR parity buffer affected with the die page failure; and
correcting the defect based on the ascending accumulation of the linked XOR parity buffers.

19. An apparatus comprising:
means for generating a first full XOR parity buffer based on first flash data associated with a first one or more XOR parity bin groups and across a first one or more of a plurality of wordlines; and
means for generating a first reduced XOR parity buffer based on the first full XOR parity buffer and second flash data associated with a second one or more XOR parity bin groups and across a second one or more of the plurality of wordlines,
wherein the first reduced XOR parity buffer is smaller in size than the first full XOR parity buffer.

20. The apparatus of claim 19, further comprising:
means for generating a plurality of reduced XOR parity buffers, each reduced XOR parity buffer of the plurality of reduced XOR parity buffers is based on the first full XOR parity buffer, the first reduced XOR parity buffer, and third flash data associated with a third one or more XOR parity bin groups and across a third one or more of the plurality of wordlines; and
means for generating a second full XOR parity buffer based on the first full XOR parity buffer, the first reduced XOR parity buffer, the plurality of reduced XOR parity buffers, and fourth flash data associated with a fourth one or more XOR parity bin groups and across a fourth one or more of the plurality of wordlines.

* * * * *